United States Patent
Angermann (10) Patent No.: US 9,831,411 B2
(45) Date of Patent: Nov. 28, 2017

(54) THERMOELECTRIC MODULE

(71) Applicant: MAHLE International GmbH, Stuttgart (DE)

(72) Inventor: Hans-Heinrich Angermann, Stuttgart (DE)

(73) Assignee: MAHLE International GmbH, Stuttgart (DE)

(*) Notice: Subject to any disclaimer, the term of this patent is extended or adjusted under 35 U.S.C. 154(b) by 19 days.

(21) Appl. No.: 14/276,315

(22) Filed: May 13, 2014

(65) Prior Publication Data

US 2014/0332049 A1    Nov. 13, 2014

(30) Foreign Application Priority Data

May 13, 2013  (DE) .......................... 10 2013 208 769

(51) Int. Cl.
*H01L 35/02* (2006.01)
*H01L 35/32* (2006.01)

(52) U.S. Cl.
CPC .................................... *H01L 35/32* (2013.01)

(58) Field of Classification Search
CPC ....................................................... H01L 35/32
USPC .......................................................... 136/230
See application file for complete search history.

(56) References Cited

U.S. PATENT DOCUMENTS

| | | | | |
|---|---|---|---|---|
| 2,906,801 A | * | 9/1959 | Fritts | H01L 35/00 |
| | | | | 136/222 |
| 3,880,674 A | * | 4/1975 | Saunders | H01L 35/08 |
| | | | | 136/237 |
| 4,328,676 A | * | 5/1982 | Reed | F25B 21/04 |
| | | | | 62/3.62 |
| 5,448,109 A | * | 9/1995 | Cauchy | H01L 35/16 |
| | | | | 257/64 |
| 5,982,013 A | * | 11/1999 | Kishi | H01L 35/32 |
| | | | | 257/467 |
| 6,424,533 B1 | * | 7/2002 | Chu | H01L 23/38 |
| | | | | 257/930 |
| 6,499,306 B2 | * | 12/2002 | Gillen | F25B 21/04 |
| | | | | 62/129 |
| 2002/0062649 A1 | * | 5/2002 | Ohkubo | H01L 35/00 |
| | | | | 62/3.7 |

(Continued)

FOREIGN PATENT DOCUMENTS

| | | |
|---|---|---|
| DE | 10 2007 028 791 A1 | 1/2008 |
| DE | 10 2010 035 151 A1 | 2/2012 |
| JP | H 11-298053 A | 10/1999 |

*Primary Examiner* — Tamir Ayad
(74) *Attorney, Agent, or Firm* — Muncy, Geissler, Olds & Lowe, P.C.

(57) ABSTRACT

A thermoelectric module having a first and second housing element, at least two thermoelectric elements arranged between the housing elements and are each connected electrically to one another via first or second electrical contacts or are connected electrically to an electrical circuit via first and/or second electrical contacts. The first electrical contacts are assigned to the first housing element and the second electrical contacts are assigned to the second housing element. The first housing element and/or the second housing element have at least one opening, which is covered by at least one section of the first electrical contacts and/or the second electrical contacts. The first electrical contacts and/or the second electrical contacts are connected to the first housing element and/or the second housing element.

16 Claims, 2 Drawing Sheets

(56) References Cited

U.S. PATENT DOCUMENTS

| | | | |
|---|---|---|---|
| 2006/0137360 A1* | 6/2006 | Ghoshal | F25B 21/02 |
| | | | 62/3.7 |
| 2008/0000511 A1 | 1/2008 | Kuroyanagi et al. | |
| 2008/0066798 A1* | 3/2008 | Sakurada | C22C 30/00 |
| | | | 136/239 |
| 2008/0121263 A1* | 5/2008 | Schutte | H01L 35/32 |
| | | | 136/203 |
| 2010/0193001 A1* | 8/2010 | Hirono | C22C 12/00 |
| | | | 136/205 |
| 2013/0098418 A1* | 4/2013 | Polcyn | C03B 5/235 |
| | | | 136/205 |
| 2013/0160807 A1 | 6/2013 | Brueck | |

* cited by examiner

THERMOELECTRIC MODULE

This nonprovisional application claims priority under 35 U.S.C. §119(a) to German Patent Application No. 10 2013 208 769.1, which was filed in Germany on May 13, 2013, and which is herein incorporated by reference.

BACKGROUND OF THE INVENTION

Field of the Invention

The present invention relates to a thermoelectric module having a first housing element and having a second housing element, whereby at least two thermoelectric elements are arranged between the housing elements, whereby at least two thermoelectric elements are each connected electrically to one another via first electrical contacts or via second electrical contacts or are connected electrically to an electrical circuit via first electrical contacts and/or second electrical contacts, whereby the first electrical contacts are assigned to the first housing element and the second electrical contacts are assigned to the second housing element.

Description of the Background Art

Thermoelectric modules can be used both as so-called Peltier elements and as thermoelectric generators. In this regard, either a heat transport can be realized due an applied voltage, or current can be produced along a thermoelectric module due to a temperature difference.

The structure of the thermoelectric modules is the same in principle in both applications. Thermoelectric modules can be produced, for example, from a plurality of stacked layers and components. Thermoelectric elements are often connected to one another by means of electrical contacts. The thermoelectric elements in this case are integrated in a housing. Electrical insulation can be provided between the housing and electrical contacts or between the thermoelectric element and the housing. Electrical insulation is provided particularly when the housing is made of an electrically conductive material.

A temperature difference as large as possible across the thermoelectric module is advantageous to achieve as great a current yield as possible. Although heat is transported from one outer surface to another outer surface via the thermoelectric module, a temperature difference between the particular outer surfaces results from the desired low heat conductivity of the TE components. The less heat is transported, the greater the arising temperature difference.

It is particularly disadvantageous in thermoelectric modules that because of the large temperature differences, different expansions of the thermoelectric module occur on the particular hot and cold side. This results in high mechanical loading of the thermoelectric modules and can lead to failure of the thermoelectric modules.

A disadvantage of the solutions in the conventional art is particularly the non-optimal material selection for the particular hot side and cold side of the thermoelectric modules.

SUMMARY OF THE INVENTION

It is therefore an object of the present invention to provide a thermoelectric module, which is optimized and is characterized particularly by application-oriented materials and improved heat transfer.

An exemplary embodiment of the invention provides a thermoelectric module having a first housing element and having a second housing element, whereby at least two thermoelectric elements are arranged between the housing elements, whereby at least two thermoelectric elements are each connected electrically to one another via first electrical contacts or via second electrical contacts or the at least two thermoelectric elements are each connected electrically to an electrical circuit via first electrical contacts and/or second electrical contacts, whereby the first electrical contacts are assigned to the first housing element and the second electrical contacts are assigned to the second housing element, whereby the first housing element and/or the second housing element have at least one opening, which is covered by at least one section of the first electrical contacts and/or the second electrical contacts, whereby the first electrical contacts and/or the second electrical contacts are connected to the first housing element and/or the second housing element.

In their use, thermoelectric modules are often exposed to an environment that is characterized particularly by a large temperature difference. The temperature difference in the case of a thermoelectric generator can be produced, for example, by two media with a different temperature that flow around the thermoelectric module. In this regard, especially the housing elements are exposed to large temperature differences. The heat transfer occurs substantially between the thermoelectric module and the media via the housing elements.

The housing element, which is exposed to the medium with the higher temperature, forms a hot side of the thermoelectric module. The respective other housing element accordingly forms a cold side of the thermoelectric module. This applies at least to thermoelectric modules that are used for current generation.

Thermoelectric modules, which are used to transport heat, can also be exposed to two media with the same temperature. A hot side and a cold side also form on the thermoelectric module by conduction of electrical current across the thermoelectric module.

The electrical contacts covering the openings present in the housing elements, due to the existing openings are acted upon directly by the particular media flowing over the housing element. A better heat transfer occurs as a result. The openings are covered from the inner side of the thermoelectric module by the electrical contacts, which connect the thermoelectric elements to one another or to the electrical circuit. In this way, the openings are closed such that a medium flowing over the housing element on the outside cannot penetrate into the interior of the thermoelectric module. To this end, the connection between the electrical contacts and the housing element can be sealed by a suitable method known to one skilled in the art.

In an exemplary embodiment, it can be provided that the first electrical contacts and the first housing element and/or the second electrical contacts and the second housing element are each made of the same material.

This is particularly advantageous in case, for example, that a joining material, particularly an elastic joining material, is provided between the electrical contacts and the particular housing element. Selection of the same material assures that the expansions or compressions of the housing element and the specific electrical contacts turn out to be similar. Thus, the thermomechanical load on the thermoelectric module and especially the load on the joining material are reduced overall.

Furthermore, the area covering the opening of the first electrical contacts and/or the second electrical contacts can have an electrically insulating layer and/or a corrosion-protecting layer.

The area, covering the opening, of the electrical contacts can be acted upon directly by the medium flowing over the particular housing element. It can be provided, therefore, that this area has an electrically insulating layer, which prevents a short circuit between the electrical contact and the medium or the housing element. An electrically insulating layer can be formed by a ceramic coating, for example. Advantageously, the electrically insulating layer has a negligible thermal insulation effect.

In addition or alternatively, the area covering the opening can also have a protective layer protecting the electrical contacts from corrosive effects.

Whether an electrically insulating layer or a layer protecting from corrosive effects is provided depends on the employed medium flowing over the particular housing element, and on the material of the electrical contact. When no corrosive effects arise from this medium and/or the medium is not electrically conductive, no protective layers need to be provided. They may be provided prophylactically, however.

Advantageously, the areas of the electrical contact that do not bridge the opening can also be coated with an electrically insulating layer and/or with a layer protecting from corrosive effects. The first electrical contacts and/or the second electrical contacts can be connected to the first housing element and/or to the second housing element by a joining material.

The first electrical contact, as a departure from a two-dimensional geometry, can be designed such that it has one or more fin-like formations, which project into the cooling medium through the openings of the first housing element and improve the heat dissipation in the cooling medium. The fin-like formations can either be impressed onto the first electrical contact by reshaping or can be joined to a two-dimensional first electrical contact by welding, soldering, etc.

The electrical contacts can be connected especially easily to the particular housing elements by a joining material, which advantageously has elastic properties. The joining material in this case can be, for example, an adhesive. Advantageously, the joining material achieves a decoupling of the electrical contacts from the particular housing elements.

The joining material can create a mechanical and/or electrical insulation between the particular housing element and the particular electrical contacts, whereby the joining material is formed either by a silicone and/or by a polyurethane.

In particular, a mechanical decoupling is especially advantageous for the operating life of the thermoelectric module. A mechanical decoupling can be achieved, for example, via elastic materials such as, for example, silicone or polyurethane. The elastic joining material can absorb the expansions and compressions arising as a result of the thermomechanical stresses during operation. In addition, the joining material advantageously can have an electrically insulating function, which then can replace at least partially an electrically insulating layer on the housing element or the electrical contact material.

The employed joining material can be selected as a function of the properties of the medium with which the joining material comes into contact during the operation of the thermoelectric module. Further, the ambient temperature of the thermoelectric module is significant, because the joining material must be suitable to withstand the arising ambient temperatures during operation without being damaged thereby.

The layer thickness of the elastic joining material can be between 0.05 and 2 mm, preferably between 0.1 and 1.5 mm, and especially preferably between 0.2 and 1.0 mm.

An alternative exemplary embodiment of the invention provides that the first housing element can be made of, for example, aluminum, magnesium, zinc, copper, or manganese, or of an alloy, for example, aluminum, magnesium, zinc, copper, manganese, or iron.

Used preferably for the housing element of the cold side are materials that are characterized by a high coefficient of thermal expansion $\alpha$ or at least by a considerably higher coefficient of thermal expansion than the housing element on the hot side. Furthermore, additionally a modulus of elasticity E that is as low as possible is advantageous. During operation, because of the temperatures of the surrounding media, the thermoelectric module experiences mechanical stresses that result in an expansion or compression of the thermoelectric module. The lowest possible modulus of elasticity E is advantageous in order to keep the elastic portion in the arising deformation due to heating or cooling as large as possible.

Therefore, aluminum, aluminum alloys, magnesium, magnesium alloys, zinc or zinc alloys, manganese and manganese alloys, and austenitic Fe alloys may be used as materials for the housing element on the cold side. Copper or copper alloys may also be provided. However, they have a lower coefficient of thermal expansion $\alpha$. Austenitic Fe alloys that can be mentioned are especially the typical cost-effective austenitic stainless steels such as 1.4301, which at room temperature in fact also have a rather low coefficient of thermal expansion of about $16 \cdot 10^{-6}$ 1/K, which need not be disadvantageous, however, because of the use of an elastic joining material between the housing element and the electrical contact on the cold side and the mechanical decoupling based thereon.

The material aluminum or alloys thereof are especially advantageous here. Aluminum has both a high coefficient of thermal expansion $\alpha$ and a low modulus of elasticity E. Moreover, aluminum and alloys thereof are cost-effective, globally available, easily workable, and relatively corrosion-resistant. These advantages also apply to the electrical contacts (traces) on the cold side. Moreover, an electrically insulating layer can be easily applied to housing material made of aluminum. This can occur, for example, by anodizing.

Materials with an especially high coefficient of thermal expansion such as, for example, Pernifer 1407, Pernifer 2002, Pernifer 2006, Pernifer 2206, Pernifer 2508 and Pernima 72 can also be used. Pernima 72 is characterized especially by a very high coefficient of thermal expansion $\alpha$.

A table with different materials is presented below, which can be used advantageously for the housing element on the cold side. The coefficient of thermal expansion $\alpha$, resistivity $\sigma$, and the modulus of elasticity E at room temperature are provided.

TABLE 1

Material Parameters of Selected Materials, Particularly for the Housing Element on the Cold Side, at Room Temperature

| | $\alpha$ in $10^{-6}$/K | $\sigma$ in $\Omega mm^2/m$ | E in GPa |
|---|---|---|---|
| Aluminum (Al) | 23.8 | 2.7E−02 | 68 |
| Magnesium (Mg) | 24.5 | 4.5E−02 | 45 |
| Zinc (Zn) | 29.8 | 5.9E−02 | 94 |
| Copper (Cu) | 16.5 | 1.7E−02 | 125 |
| Manganese (Mn) | 21.7 | 1.6 | 191 |
| Austenitic stainless steel, e.g., 1.4301 | 16.0 | 0.73 | 200 |

The second housing element can be made of a material with a coefficient of thermal expansion (a), which is less than $20 \times 10^{-6}$ 1/K, thereby preferably less than $16 \times 10^{-6}$ 1/K, and thereby preferably less than $12 \times 10^{-6}$ 1/K.

The lower the coefficient of thermal expansion $\alpha$, the more advantageous the material is for the housing element on the hot side. The low coefficient of thermal expansion $\alpha$ results in a lower expansion of the housing element due to high temperatures. This is particularly beneficial for the durability of the thermoelectric module, because the loads due to a low expansion or compression are also reduced.

In addition, it can be especially advantageous, if the second housing element is made of at least one of the materials: tungsten, tantalum, niobium, chromium, nickel, aluminum oxide, aluminum nitride, zirconium oxide, silicon carbide, and silicon nitride, or of an alloy of at least one the materials: molybdenum, tungsten, tantalum, niobium, chromium, nickel, and iron.

Iron materials and iron-based alloys may be used for the second housing element, i.e., the housing element on the hot side. These include, for example, the ferritic stainless steels 1.4016, 1.4509, 1.4737, and Pernifer 2918 with a low coefficient of thermal expansion. Furthermore, refractory metals such as molybdenum, tungsten, tantalum, niobium, and chromium and the specific alloys thereof can be used for the housing element on the hot side. Ni and Ni alloys may also be used such as, e.g., 2.4856, which in fact have an increased coefficient of thermal expansion, but also still have a yield strength of about 400 MPa at elevated temperatures.

Ceramic materials can also be used as an alternative to metallic housing elements. These include, for example, aluminum oxide ($Al_2O_3$), aluminum nitride (AlN), zirconium oxide ($ZrO_2$), silicon carbide (SiC), silicon nitride ($Si_3N_4$), and mixed oxides. With regard to the coefficient of thermal expansion $\alpha$, this applies particularly to the housing element on the hot side.

The parameters of the coefficient of thermal expansion $\alpha$, resistivity $\sigma$, and the modulus of elasticity E for various especially suitable steels, refractory metals, and a ceramic are presented in the following table. Here as well, the resistivity of the metals is also listed in the context of using these materials as traces on the hot side.

TABLE 2

Material Parameters of Selected Materials, Particularly for the Housing Element on the Hot Side, at Room Temperature

| | $\alpha$ in $10^{-6}$/K | $\sigma$ in $\Omega mm^2/m$ | E in GPa |
|---|---|---|---|
| 1.4016/1.4509 | 10.0 | 6.0E−01 | 220 |
| 1.4737 | 10.5 | 6.0E−01 | 220 |
| Pernifer 2918 | 6.5 | 4.9E−01 | 160 |
| Molybdenum (Mo) | 5.0 | 5.1E−02 | 336 |
| Tungsten (W) | 4.5 | 5.5E−02 | 415 |
| Tantalum (Ta) | 6.6 | 1.2E−01 | 188 |
| Niobium (Nb) | 8.6 | 1.3E−01 | 160 |
| Chromium (Cr) | 7.2 | 1.4E−01 | 190 |
| Nickel (Ni) | 13.4 | 1.4 | 200 |
| $Al_2O_3$ (99.7%) | 8.5 | — | 380 |

Materials with an iron base are especially preferred for the housing element on the hot side. These are readily available globally, have good processability, and can be obtained at a reasonable price on the market; Ni alloys are included here as well because of the exceptionally high hot yield strength, which also still allow an elastic deformation at increased thermomechanical stresses.

In an exemplary embodiment, the coefficient of thermal expansion $\alpha$ of the first housing element and/or the first electrical contacts (cold side) is greater than the coefficient of thermal expansion $\alpha$ of the second housing element and/or the second electrical contacts (hot side).

Temperatures of approximately 400° to 550° Celsius can occur typically on the hot side. In contrast, temperatures up to approximately 120° Celsius can occur on the cold side. The use of similar materials therefore results in a greatly different development of mechanical stresses on the housing element on the cold side and the housing element on the hot side. This may negatively impact the durability of the thermoelectric module or failure of the thermoelectric module.

The housing elements and the electrical contacts on the hot side, which are characterized by a planar expansion, can be made of a material characterized by the lowest possible coefficient of thermal expansion $\alpha$. The housing elements and the electrical contacts on the cold side can be made of a material with a high coefficient of thermal expansion $\alpha$.

The high coefficient of thermal expansion $\alpha$ on the cold side is especially advantageous, because on the cold side a certain heating compared with the ambient temperature also occurs during operation. The expansion differences between the hot side and the cold side can be moderated by a material with a high coefficient of thermal expansion $\alpha$ on the cold side.

The statements are also applicable even if on the cold side an elastic joining material is used that effectively decouples different thermal expansions between housing elements on the cold and hot side. The reason is a bonded, rigid joint connection, which is to be exposed to the lowest possible thermomechanical stresses, between housing element on the hot side and the electrical contact on the cold side.

The first housing element and/or the second housing element can have a thickness of less than 0.3 mm, thereby preferably less than 0.2 mm, and thereby preferably less than 0.1 mm.

In addition, efforts to avoid high thermomechanical stresses can also be aided by an advantageous design of the housing element on the cold side. In particular, thermomechanical stresses due to elastic or optionally plastic deformations can be reduced by the thinnest possible design of the housing element on the cold side. Advantageously, the housing element on the cold side in this case can be formed from a film-like material. This is particularly advantageous when using metallic materials.

An electrical insulation can be arranged in each case between the first electrical contacts and the first housing element and/or between the second electrical contacts and the second housing element.

To avoid short circuits, electrical insulations can be provided between the electrical contacts and the particular housing elements. This applies especially if electrically conductive materials are used for the housing elements. In general, the electrical insulation is applied over the entire surface to the housing element.

It is especially advantageous in an embodiment, if the electrical insulation is not applied to the entire surface between the electrical contacts and the housing elements, because the thermomechanical stresses can be reduced better in this way.

The electrical insulation can project over the electrical contacts only so far that electrical contact between the housing elements and the electrical contacts is prevented. Preferably this can be achieved in that the electrical insulation projects, for example, by 0.1 mm to 1.0 mm, preferably 0.25 to 0.75 mm, beyond the electrical contacts. If desired, the projection of the electrical insulations after the application of the electrical traces can either be removed completely or at least partially.

The electrical insulation and/or the electrical contacts can be applied by thermal spraying to the housing elements and/or the thermoelectric elements.

A bonded connection between the sprayed-on material and the particular substrate material can be produced in an especially simple way by the thermal spraying of electrical insulation and/or the electrical contacts onto the housing elements and/or the thermoelectric elements. The process of the thermal spraying can be easily automated in an industrial process, so that the processing can occur cost-effectively.

For the electrical insulation ceramic layers such as, e.g., $Al_2O_3$ can be applied especially advantageously. If necessary, the adhesion of the sprayed-on layers can be improved by the application of intermediate adhesive/buffer layers such as, e.g., NiCrAlY. This is useful particularly for the housing element on the cold side. NiCrAlY with a coefficient of thermal expansion of about $14 \cdot 10^{-6}$ 1/K represents a transitional layer between the high value for the housing element on the cold side and the insulating ceramic. The porous nature of a thermally sprayed-on insulating ceramic layer has an advantageous effect in this regard; it assists in being able to reduce mechanical stresses due to certain movements within the layer.

In an especially favorable embodiment of the invention, it is provided in addition that a material whose modulus of elasticity E is within a range of 5 GPa to 200 GPa, preferably of 15 GPa to 120 GPa, thereby preferably of 20 GPa to 100 GPa, is used for the first housing element and/or the first electrical contacts.

The lowest possible modulus of elasticity E is especially advantageous to achieve a highest possible elastic deformation component in the total deformation. In this regard, preferably materials with a modulus of elasticity E in an above-mentioned range are advantageous, particularly for the housing element and/or the electrical contacts on the cold side. A highest possible elastic deformation component is beneficial for the operating life of the thermoelectric module, because the plastic deformation component is accordingly much lower.

It is also advantageous in an embodiment, if a material, whose modulus of elasticity E is within a range of 100 GPa to 500 GPa, preferably of 140 GPa to 300 GPa, thereby preferably of 160 GPa to 250 GPA, is used for the second housing element and/or the second electrical contacts.

A material that has a modulus of elasticity E in the above range is used advantageously for the housing element and/or the electrical contacts on the hot side. This results from the fact that the primary selection criterion for materials for the hot side is a low coefficient of thermal expansion and such materials have a value for the E modulus in the rather high range. It basically applies here as well that the lowest possible modulus of elasticity E is to be preferred. In comparison with the materials used for the housing element and/or the electrical contacts on the cold side, the advantageous range for the modulus of elasticity E for the housing element and/or the electrical contacts on the hot side is higher. The lowest possible value for the modulus of elasticity E is to be selected on the hot side as well.

In an embodiment of the invention, it can be provided that the first electrical contacts and/or the second electrical contacts are made from a multilayer material.

The electrical contacts can be formed, for example, by traces. Aluminum or an aluminum alloy can be used advantageously in particular for the electrical contacts on the cold side. This is based on the good material parameters for the intended use. Aluminum or aluminum alloys have a high coefficient of thermal expansion $\alpha$, a low modulus of elasticity E, and a low resistivity $\sigma$. The lowest possible electrical resistance for the trace is desirable; therefore generally the pure substance (in this case aluminum) of the alloy (in this case the Al alloy) is preferred. As between the housing element and electrical insulation layer, an adhesion/buffer layer can also be applied between the electrical insulation layer and the electrical contact layer.

In order to create a better adhesive base for the connection with the thermoelectric elements or the housing elements, for example, a further material layer can be applied to the base material of the electrical contacts. In this regard, for example, a silver layer can be applied to the electrical contacts by techniques such as thermal spraying, electroplating, or the brush electroplating.

Moreover, it can be advantageous, if the first electrical contacts and/or the second electrical contacts are formed by traces, whereby these are preferably spaced apart by more than 1 mm, thereby preferably by more than 2 mm, and thereby preferably by more than 3 mm. This also applies to the electrical insulations. This is advantageous so that the housing element can deform under stresses arising during operation. The previously indicated distance between the electrical contacts becomes smaller for electrical insulation layers by double the projection of the electrical insulation layers beyond the electrical contact layers.

The joining of the particular housing element, the particular electrical contacts, and the thermoelectric elements can occur at a temperature which is within an interval of ±50° Celsius around a median temperature between the ambient temperature and the particular operating temperature of the thermoelectric module.

This is particularly advantageous, because the thermomechanical stresses in the material are equal to zero at the particular joining temperature. From the thermomechanical standpoint, it is especially advantageous for the thermoelectric module, if the thermomechanical stress experienced by the module between the operating state and the idle state, moves around a zero value.

A possible joining method for joining the housing element and the particular electronic contacts is, for example, silver sintering. Silver sintering can also be used especially to connect the electrical contacts with the thermoelectric elements.

The first electrical contacts and/or the second electrical contacts can be made of a material with a low resistivity $\sigma$ of less than 0.6 $\Omega mm^2/m$, thereby preferably less than 0.1 $\Omega mm^2/m$, and thereby preferably less than 0.06 $\Omega mm^2/m$.

In general, it is advantageous both for the electrical contacts on the cold side and for the electrical contacts on the hot side for the resistivity $\sigma$ to be as low as possible, so that at a specific trace thickness the ohmic power loss is as low as possible. Conversely, the trace thickness at a predetermined maximum ohmic power loss also remains as low as possible.

Materials with a low coefficient of thermal expansion $\alpha$ and a low resistivity $\sigma$ are used advantageously particularly for the material of the electrical contacts on the hot side. Therefore, molybdenum, tungsten, and alloys thereof in particular are advantageous. An example for an advantageous alloy is molybdenum-rhenium 5 (MoRe5), which in addition has an advantageous ductility.

In comparison with molybdenum and molybdenum alloys, tungsten and tungsten alloys have the advantage that they have a still lower coefficient of thermal expansion α and have a greater resistance to oxidation at higher temperatures.

Advantageously, in light of cost and a small difference in thermal expansion between the second housing element (advantageously made of a ferritic stainless steel such as 1.4016 or 1.4509) and the second electrical contact, the second electrical contact can be made of Fe, Ni, or Cu.

In an exemplary embodiment, it can be provided that the first housing element and the second housing element are connected together by a joining technique such as, for example, welding, soldering, or gluing, whereby the first housing element and the second housing element are made of the same material. For the material, in this case, the material specification for the second housing element applies, i.e., the material should have a rather low coefficient of thermal expansion, as is the case, e.g., with 1.4016.

Possible joining techniques in principle are all joining techniques suitable for creating a fluid-tight connection between the above-described possible material combinations. To be able to carry out techniques such as welding or soldering especially easily, for instance, it is advantageous if both housing elements are made of the same material.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
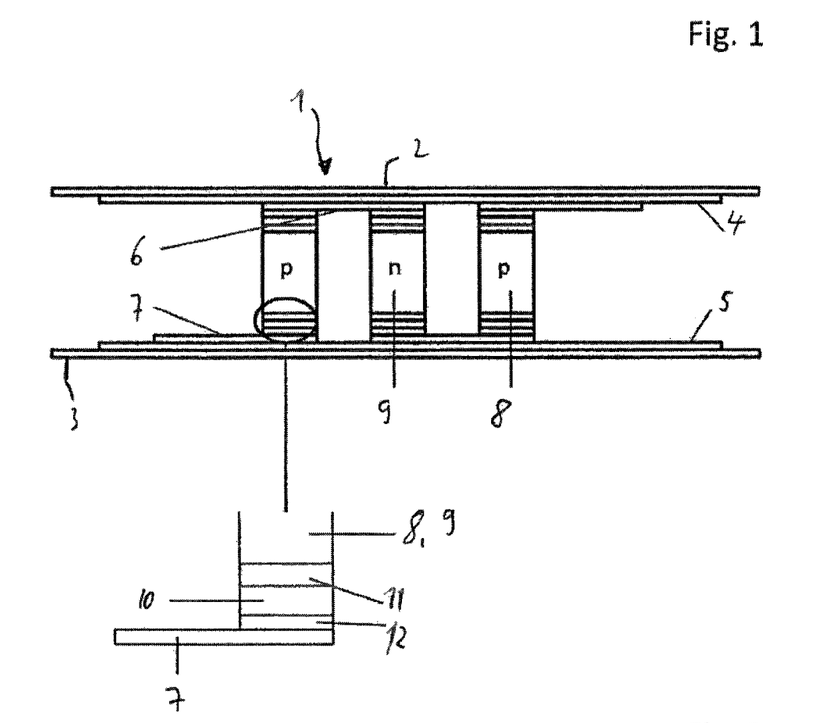
FIG. 1 in a top part shows a sectional view through a thermoelectric module according to an exemplary embodiment with a plurality of thermoelectric elements arranged adjacent to one another, whereby the thermoelectric elements are connected to one another via electrical contacts and electrically insulated from the housing elements via electrical insulations, and in the bottom part of FIG. 1 a detailed view is shown of the base region of one of the thermoelectric elements.

FIG. 1 in the top illustration shows the basic structure of a thermoelectric module 1 according to an exemplary embodiment of the present invention. A sectional view through thermoelectric module 1 is shown.

Thermoelectric module 1 has a first housing element 2 and a second housing element 3. Housing elements 2, 3 are shown as substantially flat bodies in FIG. 1. FIG. 1 shows only a section of thermoelectric module 1. In an area that is not shown, housing elements 2, 3 can be continued such that they come into contact with one another and close off the thermoelectric module outwardly. It can also be provided that the housing elements are not parallel to one another or have, for example, surface elements such as fins.

Housing elements 2, 3 in each case are produced from a basic material. Particularly both metallic materials and ceramic materials may be used as the basic material. More precise information on the materials that may be used and the material parameters to be preferred in each case have been given in the preceding introduction to the description.

In FIG. 1, an electrical insulation 4, 5 is applied substantially over the entire surface on each housing element 2, 3. Electrical insulation 4, 5 is particularly necessary, when housing elements 2, 3 are made from a metallic material or some other electrically conductive material. Ceramic layers in particular can be provided as electrical insulation 4, 5. These can be sprayed on thermally, for example. Adhesion-promoting/buffer layers such as, e.g., NiCrAlY, Al-bronzes, or Al—Si, (not shown in FIG. 1) can be applied between housing elements 2, 3 and electrical insulation layers 4, 5.

Electrical insulations 4, 5 separate housing elements 2, 3 from electrical contacts 6, 7, which connect thermoelectric elements 8, 9 to one another and not to an electrical circuit (not shown).

Electrical contacts 6, 7, as shown in FIG. 1, can be formed by traces, which are applied either to electrical insulation 4, 5, housing elements 2, 3, or thermoelectric elements 8, 9. The traces can be formed by a metallic layer, which is applied, for example, by thermal spraying.

Thermoelectric elements 8, 9 are p-doped semiconductors and n-doped semiconductors. These are connected alternately in series via electrical contacts 6, 7. In this case, a p-doped semiconductor is connected alternately to an adjacent n-doped semiconductor. The number of thermoelectric elements 8, 9 is variable here. As a departure from the shown series connection, the thermoelectric elements can also be arranged in different circuit arrangements.

In the bottom area of FIG. 1, by way of example, a base region of a p-doped semiconductor is shown, which is connected to an electrical contact 7. In this case, different intermediate layers are arranged between the p-doped semiconductor and electrical contact 7. The shown bottom area faces the bottom housing element 3. The statements apply similarly to an n-doped semiconductor, electrical contacts 6, and the intermediate layers arranged between them. Likewise the statements apply similarly to the specific top area of thermoelectric elements 8, 9, which face top housing element 2.

It can be seen that the p-doped semiconductor is connected via a joining material 10 to electrical contact 7. A layer 11 is arranged between joining material 10 and the p-doped semiconductor. Layer 12 is arranged between electrical contact 7 and joining material 10. In FIG. 1, layer 11 corresponds to a diffusion barrier and an adhesion-promoting layer and layer 12 to an adhesion-promoting layer. These layers can be a single layer or preferably multiple layers, whereby each layer is made of a different material.

A buffer layer, which eliminates or moderates the harmful effect of different coefficients of thermal expansion, such as, e.g., NiCrAlY, Al-bronzes, or Al—Si, can be arranged between the housing element and the electrical insulation layer. Such a buffer layer can also be arranged between the electrical insulation and the electrical contact. Diffusion barrier 11 prevents an inward diffusion of atoms or molecules from joining material 10 into the thermoelectrically active material of thermoelectric element 8. Adhesion-promoting layer 12 permits good adhesion of the joining material. An inward diffusion could bring about a deterioration of the thermoelectric properties of thermoelectric element 8.

Joining material 10 can be applied, for example, by using temperature-assisted pressing. Alternatively, joining material 10 can be applied by thermal spraying or dosed on in the form of a paste, imprinted, etc., or applied in the form of a film.

Adhesion-promoting layer 12 can be applied, for example, by thermal spraying to electrical contact 7. Adhesion-promoting layer 12 can be formed advantageously by silver or a silver-based material.

Alternatively or in addition, the layer, which in FIG. 1 forms diffusion barrier 11, can also be formed as an adhesion-promoting layer or have a suitable sublayer, which fulfills such an adhesion-supporting function. It can be provided, further, that the second layer, which forms adhesion-promoting layer 12, has a barrier effect against an outward diffusion of atoms or molecules out of joining material 10. With a suitable selection of the materials for electrical contact 7 and joining materials 10, the layers, forming adhesion-promoting layer 12 and diffusion barrier 11, can also be omitted.

To produce a thermoelectric module, for example, sandblasted base materials can be used, preferably sand-blasted on both sides. Naturally, other known techniques for surface activation may also be used, such as pickling, polishing, plasma treatment, etc. Electrical insulations 4, 5 are applied to these by means of thermal spraying. To this end, for example, a ceramic layer can be applied. In the case of thicker ceramic layers, first an intermediate layer is applied to reduce stresses during the coating with the ceramic layer. The intermediate layer in this case can form, for example, a buffer layer with regard to differences in the coefficient of thermal expansion of the employed materials.

Depositing of electrical contacts 6, 7 on the ceramic layer can occur, for example, again by thermal spraying. Electrical contacts 6, 7 can be coated with a further layer 11, preferably also by thermal spraying. Said further layer 11 serves, for example, as a barrier to the interdiffusion of elements and/or as an adhesion base. Of course, buffer layers can be again applied also between electrical contacts 6, 7 and electrical contacts 4, 5.

Both the electrical insulations, formed by ceramic layers 4, 5, and electrical contacts 6, 7 are sprayed on, for example, using masks. This approach is not described in greater detail here.

Figure 2:
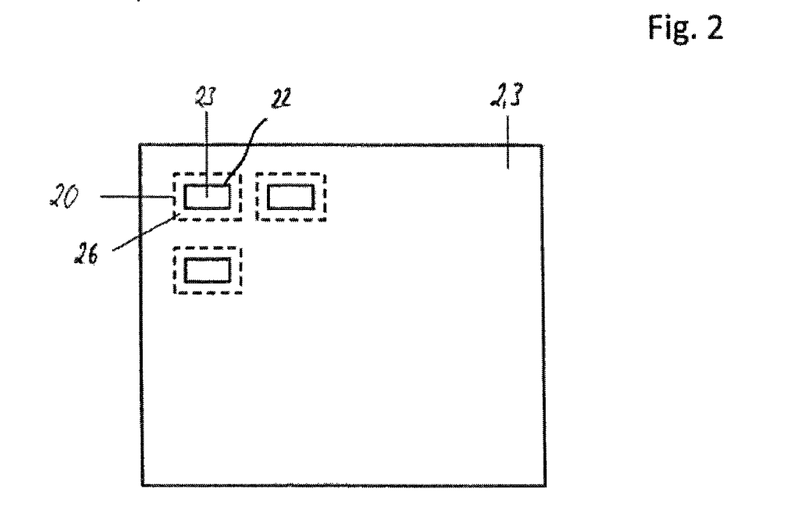
FIG. 2 shows a view of a housing element according to an exemplary embodiment from below, whereby three openings are shown, which are covered by electrical contacts.

FIG. 2 shows a view of a housing element 2, 3 of a thermoelectric module. Here, three openings 22, each of which is covered by an electrical contact 20, are shown in the top left corner of housing element 2, 3. The view here is directed to the outer side of housing element 2, 3, so that electrical contacts 20 are arranged on the side of housing element 2, 3 facing away from the viewer.

FIG. 2 shows that electrical contacts 20 project beyond openings 22 in such a way that an overlapping between housing element 2, 3 and electrical contacts 20 arises. Electrical contacts 20 are connected to housing element 2, 3 by a joining material 26 in this overlap region.

Joining material 26 in this regard can fulfill both a decoupling function and a connection function. Advantageously, joining material 26 is made of an elastic material such as, for example, silicone or polyurethane.

Area 23 of electrical contacts 20, which covers opening 22, can have one or more coatings, which represent in particular an electrical insulation and/or protection against the corrosive properties of the medium flowing over housing element 2, 3.

The three shown openings 22 are exemplary. A different number, as well as a different positioning, can also be provided in alternative embodiments.

Figure 3:
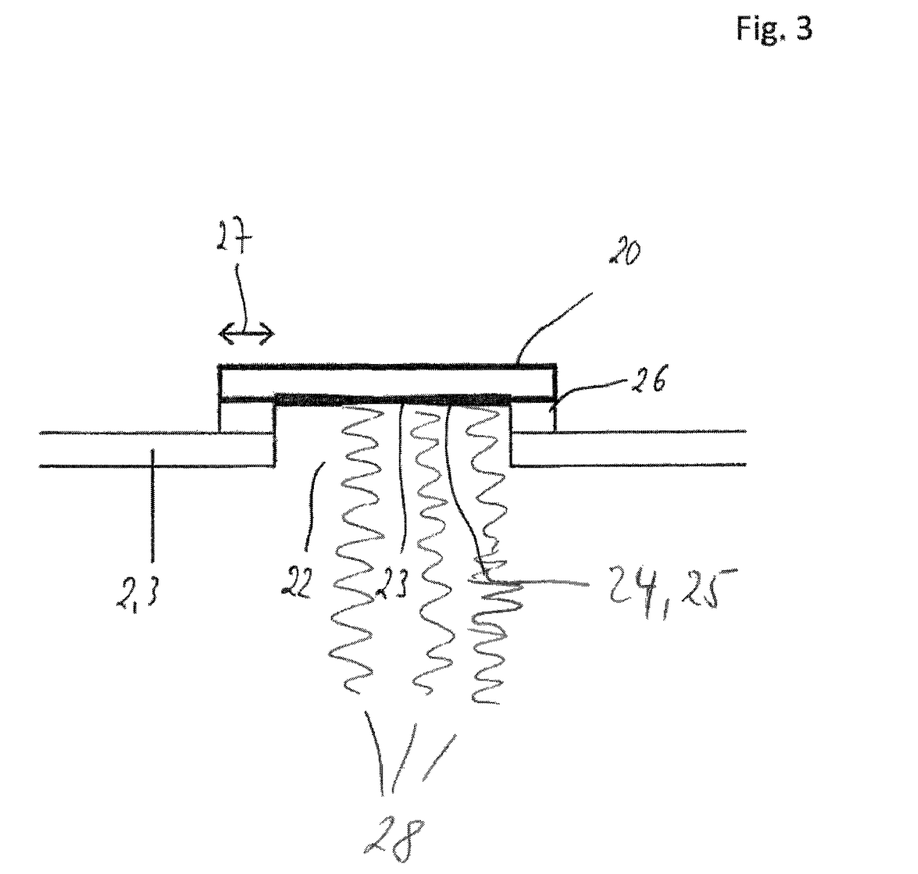
FIG. 3 shows a side sectional view of the housing element of FIG. 2, whereby an opening is shown, which is covered by an electrical contact.

FIG. 3 shows a side sectional view of an opening 22 according to FIG. 2. It can be seen in the section that electrical contact 20 is connected via a joining material 26 to housing element 2, 3. Joining material 26 in this case runs completely around opening 22. Joining material 26 thus forms a fluid-tight connection between electrical contacts 20 and housing element 2, 3.

Electrical contact 20 overlaps housing element 2, 3 in an area 27. Joining material 26 is applied over said area 27 in order to create a connection between electrical contact 20 and housing element 2, 3. Area 27 is selected here preferably such that a sufficiently large covering is assured to produce a permanent, durable connection between electrical contacts 20 and housing element 2, 3. At the same time, however, area 23, covering opening 22, is to be designed as large as possible in order to achieve the best possible heat transfer.

Area 23 can have one or more coatings. In FIG. 3, a layer 24 is indicated representing an electrical insulation. In addition, a layer 25, which represents a protective layer against corrosive influences from the outside, is indicated.

The design shown in FIG. 3 of opening 22 is exemplary. In alternative embodiments, for example, the transitions from the outer surface of the housing element to the area, projecting over the opening of the electrical contacts can be flattened by sloping. As a result, stagnation of the medium flowing over the housing element at the shoulder formed by the opening can be avoided.

In addition, electrical contact 20 may have fin-like formations 28, which extend into the cooling medium through opening 22. This improves heat removal in the cooling medium.

The exemplary embodiments shown in FIGS. 1 to 3 are by way of example and are used to clarify the inventive concept. They can be combined with one another and do not possess any restrictive nature.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A thermoelectric module comprising:
   a first housing element having a first side and a second side opposite to the first side, first electrical contacts being formed on the first side of the first housing element;
   a second housing element having a first side and a second side opposite to the first side, second electrical contacts being formed on the first side of the second housing element;
   at least two thermoelectric elements each extending between the first and second housing elements, the at least two thermoelectric elements being connected electrically to one another via the first electrical contacts or via the second electrical contacts or the at least two thermoelectric elements being connected electrically to an electrical circuit via the first electrical contacts and/or the second electrical contacts,
   wherein the first housing element, the first electrical contacts, the second housing element, the second electrical contacts and the at least two thermoelectric elements are provided in a layered configuration in which the first electrical contacts, the second electrical contacts and the at least two thermoelectric elements are positioned entirely between the first housing element and the second housing element in the following order: the first housing element, the first electrical contacts, the at least two thermoelectric elements, the second electrical contacts and the second housing element, wherein the first housing element and the second housing element each have at least one opening that is an empty space, of which a side facing the first electrical contacts and the second electrical contacts, which corresponds to the first side of the first housing element and the second housing element, respectively, is covered and closed by at least one section of the first electrical contacts and the second electrical contacts, respectively, wherein through the at least one opening of the first housing element and the second housing element, the at least one section of the first electrical contacts and the second electrical contacts a medium flowing on the second side of the first housing element and the second side of the second housing element, respectively, such that heat generated by the thermoelectric module is transferred to the medium, and wherein one of the at least two thermoelectric elements is a p-doped semiconductor and another one of the at least two thermoelectric elements is an n-doped semiconductor.

2. The thermoelectric module according to claim 1, wherein the first electrical contacts and the first housing element and/or the second electrical contacts and the second housing element are each made of the same material.

3. The thermoelectric module according to claim 1, wherein the at least one section of each of the first electrical contacts and the second electrical contacts that cover the at least one opening of each of the first housing element and the second housing element, respectively, has an electrically insulating layer and/or a corrosion-protecting layer.

4. The thermoelectric module according to claim 1, wherein the first electrical contacts and/or the second electrical contacts are connected to the first housing element and/or to the second housing element by a joining material.

5. The thermoelectric module according to claim 4, wherein the joining material creates a mechanical and/or thermal and/or electrical insulation between the first or second housing element and the first or second electrical contacts, and wherein the joining material is formed by either a silicone and/or by a polyurethane.

6. The thermoelectric module according to claim 4, wherein no electrically insulating layer is applied at least to the first housing element and/or to the first electrical contacts.

7. The thermoelectric module according to claim 1, wherein the first housing element is made of aluminum, magnesium, zinc, copper, or manganese, or of an alloy of at least one aluminum, magnesium, zinc, copper, manganese, or iron.

8. The thermoelectric module according to claim 1, wherein the second housing element is made of a material with a coefficient of thermal expansion, which is less than 20×10-6 1/K, less than 16×10-6 1/K, or less than 12×10-6 1/K.

9. The thermoelectric module according to claim 1, wherein the second housing element is made of molybdenum, tungsten, tantalum, niobium, chromium, nickel, aluminum oxide, aluminum nitride, zirconium oxide, silicon carbide, or silicon nitride, or of an alloy of molybdenum, tungsten, tantalum, niobium, chromium, nickel, or iron.

10. The thermoelectric module according to claim 1, wherein the coefficient of thermal expansion of the first housing element and/or the first electrical contacts is greater than the coefficient of thermal expansion of the second housing element and/or the second electrical contacts.

11. The thermoelectric module according to claim 1, wherein an electrical insulation is arranged between the first electrical contacts and the first housing element and/or between the second electrical contacts and the second housing element.

12. The thermoelectric module according to claim 1, wherein the first housing element and the second housing element are connected together by a joining technique, welding, soldering, or gluing, and wherein the first housing element and the second housing element are made of the same material.

13. The thermoelectric module according to claim 1, wherein fin-like formations are attached to the first electrical contacts by deformation or joining.

14. The thermoelectric module according to claim 1, wherein the at least one opening of each of the first housing element and the second housing element is open to an exterior of the housing.

15. The thermoelectric module according to claim 1, wherein an area of at least one contact of the first electrical contacts and the second electrical contacts, respectively, is larger than an area of the at least one opening of each of the first housing element and the second housing element, respectively.

16. The thermoelectric module according to claim 1, further comprising an electrical insulation layer disposed over substantially an entire surface of the first housing element and the second housing element, the insulation layer being disposed between the housing elements and the thermoelectric elements.

* * * * *